(12) United States Patent
Takahashi et al.

(10) Patent No.: US 8,975,003 B2
(45) Date of Patent: Mar. 10, 2015

(54) PHOTOSENSITIVE NEGATIVE RESIN COMPOSITION

(75) Inventors: Hyou Takahashi, Kunitachi (JP);
Masako Shimomura, Yokohama (JP);
Ken Ikegame, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/989,449

(22) PCT Filed: Dec. 2, 2011

(86) PCT No.: PCT/JP2011/078501
§ 371 (c)(1),
(2), (4) Date: May 24, 2013

(87) PCT Pub. No.: WO2012/081507
PCT Pub. Date: Jun. 21, 2012

(65) Prior Publication Data
US 2013/0235119 A1    Sep. 12, 2013

(30) Foreign Application Priority Data
Dec. 16, 2010   (JP) .................................. 2010-280474

(51) Int. Cl.
G03F 7/004 (2006.01)
G03F 7/038 (2006.01)
B41J 2/16 (2006.01)

(52) U.S. Cl.
CPC ............ *G03F 7/004* (2013.01); *G03F 7/038* (2013.01); *G03F 7/0045* (2013.01); *G03F 7/0046* (2013.01); *B41J 2/1623* (2013.01); *B41J 2/1631* (2013.01); *B41J 2/1628* (2013.01)
USPC ............ 430/280.1; 430/320; 347/20; 522/15; 522/25; 522/170

(58) Field of Classification Search
None
See application file for complete search history.

(56) References Cited

U.S. PATENT DOCUMENTS 8,278,030 B2   10/2012   Suzuki et al.
8,394,575 B2 *  3/2013   Wu et al. .................... 430/280.1
(Continued)

FOREIGN PATENT DOCUMENTS

EP   0 844 255 A1   5/1998
EP   2 023 204 A2   2/2009
(Continued)

OTHER PUBLICATIONS

Supplementary European Search Report in European Application No. 11847897.3 (dated Jun. 26, 2014).
(Continued)

*Primary Examiner* — Cynthia Hamilton
(74) *Attorney, Agent, or Firm* — Fitzpatrick, Cella, Harper & Scinto

(57) ABSTRACT

The invention provides a photosensitive negative resin composition containing (a) an epoxy-group-containing compound, (b) a first onium salt containing a cation portion structure represented by (b1) and an anion portion structure represented by (b2), and (c) a second onium salt containing a cation portion structure represented by (c1) and an anion portion structure represented by (c2).

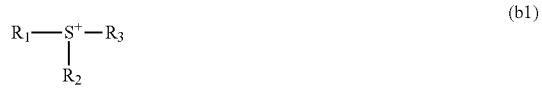

(b1)

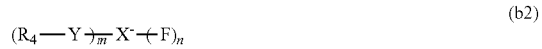

(b2)

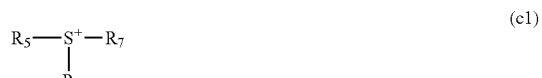

(c1)

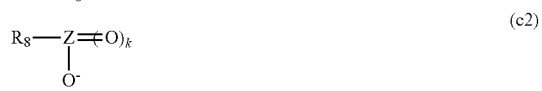

(c2)

19 Claims, 4 Drawing Sheets

(56) References Cited

U.S. PATENT DOCUMENTS

| | | |
|---|---|---|
| 2004/0167315 A1 | 8/2004 | Sasa |
| 2008/0292986 A1* | 11/2008 | Park et al. .................. 430/270.1 |
| 2008/0292993 A1 | 11/2008 | Ishikura et al. |
| 2011/0244393 A1* | 10/2011 | Ikeda ......................... 430/270.1 |
| 2012/0040288 A1* | 2/2012 | Adams et al. .............. 430/270.1 |
| 2012/0229556 A1 | 9/2012 | Ikegame et al. |

FOREIGN PATENT DOCUMENTS

| | | |
|---|---|---|
| JP | 4-10940 A | 1/1992 |
| JP | 2008-256980 A | 10/2008 |
| JP | 2011-164216 A | 8/2011 |
| WO | 2007/003507 A1 | 1/2007 |
| WO | 2009/136482 A1 | 11/2009 |
| WO | 2010/001919 A1 | 1/2010 |
| WO | 2010/134513 A1 | 11/2010 |

OTHER PUBLICATIONS

U.S. Appl. No. 14/225,662, filed Mar. 26, 2014, Takahashi.

U.S. Appl. No. 14/360,401, filed May 23, 2014, Takahashi et al.

First Office Action in Chinese Application No. 201180060350.1 (dated Nov. 3, 2014).

* cited by examiner

PHOTOSENSITIVE NEGATIVE RESIN COMPOSITION

TECHNICAL FIELD

The present invention relates to a photosensitive negative resin composition, and particularly to a photosensitive negative resin composition suitable for forming a fine structure by a photolithographic process.

BACKGROUND ART

As a microprocess technique, is known a photolithographic technique in which a negative photosensitive resin is subjected to exposure and development to form a pattern and a structure. This technology is used in a wide variety of applications, for example, production of semiconductor integrated circuits, production of masks for semiconductor exposure and production of various MEMSs. As an example of the application to the production of MEMSs, such application is advanced in various small-scale sensors, micro-probes, thin film magnetic heads, ink jet recording heads, etc. A stepper using the i-line as a light source is widely used as a device for conducting exposure. In the field of this technology, it has been required in recent years to produce a structure having a more complicated and minuter structure, and there has thus been a demand for development of a negative photosensitive resin capable of forming a fine structure exhibiting high accuracy to light from a light source through a photomask.

PTL 1 discloses, as an example of the negative photosensitive resin, a photosensitive resin composition containing a polyfunctional epoxy resin and a cationic polymerization initiator.

PTL 2 discloses, as an exemplary ink jet head in the application to the production of MEMSs, a device containing nozzles for ink jet head, said device ejecting an ink droplet by causing a bubble formed by heating a heating resistor to communicate with the air.

CITATION LIST

Patent Literature

PTL 1: Japanese Patent Application Laid-Open No. 2008-256980
PTL 2: Japanese Patent Application Laid-Open No. H04-10940

SUMMARY OF INVENTION

Technical Problem

However, the above-described composition may have had insufficient properties in the following point in some cases. As an example, when a complicated form such as an ejection orifice having a tapered form of a liquid ejection device is formed from the negative photosensitive resin using the i-line as a light source, the taper angle of the ejection orifice may vary in a chip or wafer to fail to achieve desired reproducibility in some cases.

The present invention has been made in view of the above problem and has as its object the provision of a photosensitive negative resin composition which gives less dispersion and excellent reproducibility of a three-dimensional form when a photolithographic process is applied thereto.

Solution to Problem

In order to solve the above problem, the present invention provides a photosensitive negative resin composition comprising
(a) an epoxy-group-containing compound,
(b) a first onium salt containing a cation portion structure represented by (b1) and an anion portion structure represented by (b2), and
(c) a second onium salt containing a cation portion structure represented by (c1) and an anion portion structure represented by (c2).

(b1)

(b2)

wherein $R_1$ to $R_3$ are, independently of one another, an organic group which may be substituted and has 1 to 30 carbon atoms, with the proviso that at least two oxygen atoms are included in all the constituent atoms of $R_1$ to $R_3$, X is selected from a carbon atom, a nitrogen atom, a phosphorus atom, a boron atom and an antimony atom, Y is selected from atom, a boron atom and an antimony atom, Y is selected from $—S(=O)_2—$, an alkylene fluoride group, $—OCF_2—$, $—C(=O)—CF_2—$, $—O—C(=O)—CF_2—$, $—C(=O)—O—CF_2—$ and a single bond, $R_4$ is a hydrocarbon group which may be substituted by a fluorine atom and has 1 to 30 carbon atoms, and m and n are such that m+n is 3 and n is an integer selected from 0, 1 and 2 when X is the carbon atom, m+n is 2 and n is an integer selected from 0 and 1 when X is the nitrogen atom, m+n is 6 and n is an integer selected from 0 to 6 when X is the phosphorus or antimony atom, or m+n is 4 and n is an integer selected from 0 to 3 when X is the boron atom.

(c1)

(c2)

[wherein $R_5$ to $R_7$ are, independently of one another, an organic group which may be substituted and has 1 to 15 carbon atoms, with the proviso that at most one oxygen atom is included in all the constituent atoms of $R_5$ to $R_7$, Z is selected from a carbon atom and a sulfur atom, k is 1 when Z is the carbon atom, or k is 2 when Z is the sulfur atom, and $R_8$ is a hydrocarbon group which may contain a heteroatom and has 1 to 20 carbon atoms.]

Advantageous Effects of Invention

When the photosensitive negative resin composition according to the present invention is used, a fine structure which gives less dispersion and excellent reproducibility of a three-dimensional form can be stably formed when a photolithographic process is applied thereto. The photosensitive negative resin composition according to the present invention is excellent in the reproducibility when a photolithographic process using the i-line is applied thereto in particular.

Further features of the present invention will become apparent from the following description of exemplary embodiments with reference to the attached drawings.

DESCRIPTION OF EMBODIMENTS

Figure 1:
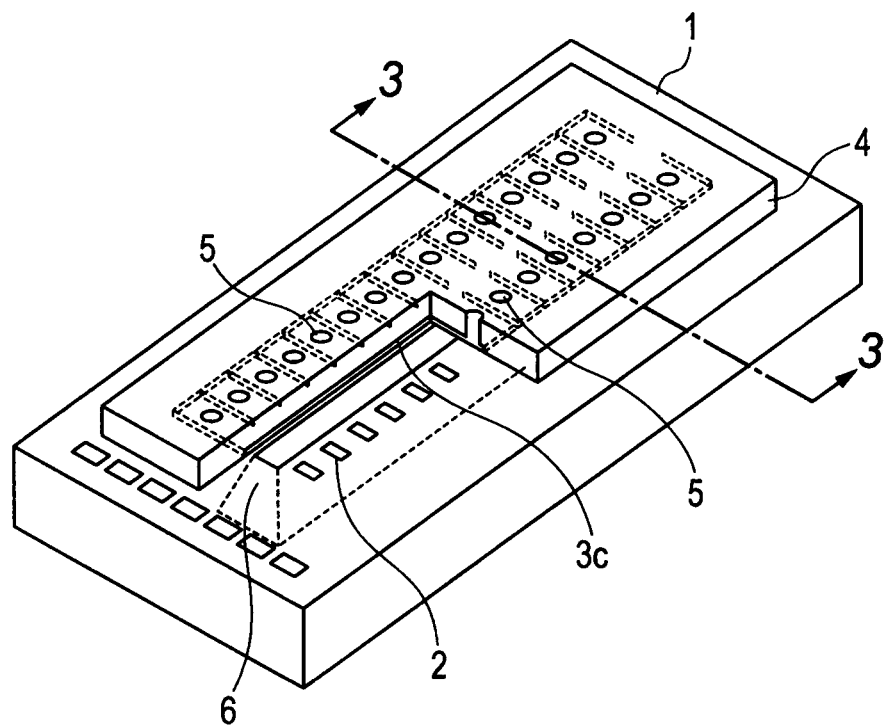
FIG. 1 is a typical perspective view illustrating the construction of an exemplary liquid ejection head.

The photosensitive negative resin composition according to the present invention will hereinafter be described in detail.

(a) Epoxy-Group-Containing Compound:

No particular limitation is imposed on the epoxy-group-containing compound (hereinafter also abbreviated as component (a)). However, the compound is favorably a polyfunctional epoxy resin compound capable of conducting epoxy polymerization and having a plurality of epoxy groups in its molecule. Examples of such a polyfunctional epoxy resin include polyfunctional alicyclic type epoxy resins, polyfunctional phenol/novolak type epoxy resins, polyfunctional ortho-cresol novolak type epoxy resins, polyfunctional triphenyl novolak type epoxy resins and polyfunctional bisphenol A novolak type epoxy resins. Among these, a polyfunctional bisphenol A novolak type epoxy resin, polyfunctional alicyclic type epoxy resin or polyfunctional phenol/novolak type epoxy resin is favorably used. The functionality thereof is favorably penta- or higher functionality. For example, "EPIKOTE 157S70" (product of Japan Epoxy Resin Co., Ltd.), "EPICLON N-865" (product of DIC Corporation) and "EHPE 3150" (product of Daicel Corporation) are available as commercially available products and more favorably used.

No particular limitation is imposed on the softening point of the epoxy-group-containing compound. However, the softening point is favorably 50° C. or more, more favorably 60° C. or more. The softening point is favorably 180° C. or less, more favorably 160° C. or less.

The content of the epoxy-group-containing compound in the solid matter of photosensitive negative resin composition is favorably 40% by mass or more, more favorably 60% by mass or more, still more favorably 65% by mass or more. The content is favorably 99.9% by mass or less, more favorably 99.2% by mass or less. A resist layer having high sensitivity and a proper hardness is thereby obtained when such a composition is applied to a substrate.

(b) First Onium Salt:

The first onium salt (hereinafter also abbreviated as component (b)) is composed of a one-to-one combination of a cation portion structure represented by (b1) and an anion portion structure represented by (b2).

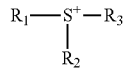
(b1)

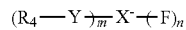
(b2)

In the cation portion structure represented by (b1), $R_1$ to $R_3$ are, independently of one another, an organic group which may be substituted and has 1 to 30 carbon atoms, with the proviso that at least two oxygen atoms are included in all the constituent atoms of $R_1$ to $R_3$.

In the anion portion structure represented by (b2), X is selected from a carbon atom, a nitrogen atom, a phosphorus atom, a boron atom and an antimony atom, Y is selected from —S(=O)$_2$—, an alkylene fluoride group, —OCF$_2$—, —C(=O)—CF$_2$—, —O—C(=O)—CF$_2$—, —C(=O)—O—CF$_2$— and a single bond, $R_4$ is a hydrocarbon group which may be substituted by a fluorine atom and has 1 to 30 carbon atoms, and m and n are such that m+n is 3 and n is an integer selected from 0, 1 and 2 when X is the carbon atom, m+n is 2 and n is an integer selected from 0 and 1 when X is the nitrogen atom, m+n is 6 and n is an integer selected from 0 to 6 when X is the phosphorus or antimony atom, or m+n is 4 and n is an integer selected from 0 to 3 when X is the boron atom.

Examples of (b1) and (b2) are mentioned. The feature of the cation portion structure represented by (b1) resides in that the photosensitivity to the i-line is high because the absorption wavelength of the component (b) can be lengthened due to the feature that at least two oxygen atoms are included. On the other hand, the anion portion structure represented by (b2) is decomposed with the component (b1) after exposure to generate an acid originated from the structure of (b2). Thereafter, a cationic polymerization reaction of the epoxy groups of the epoxy-group-containing compound can be initiated and accelerated by the action of the acid generated. The generated acid favorably has such an acid strength that the epoxy-group-containing compound is sufficiently cured. Such an acid strength that the epoxy-group-containing compound is sufficiently cured means that this acid is a strong acid not lower than hexafluoroantimonic acid in terms of Lewis acid, i.e., that its Hammett acidity function —HO is 18 or more. In terms of Brønsted acid, the acid strength means that this acid is a strong acid not lower than nanofluorobutane-sulfonic acid, i.e., that its PKa is −3.57 or more.

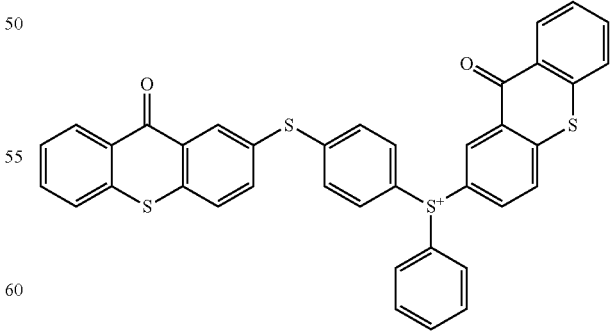

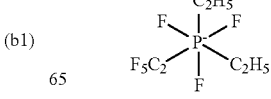

Favorable specific examples of the cation portion structure represented by (b1) are mentioned below.
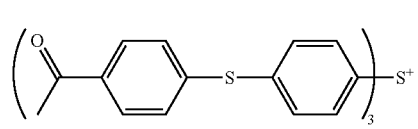
(b1-1)
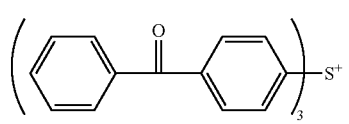
(b1-2)
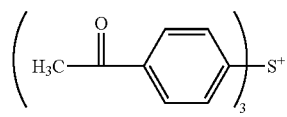
(b1-3)
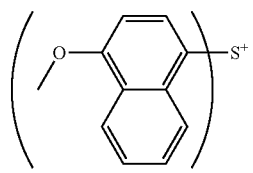
(b1-4)
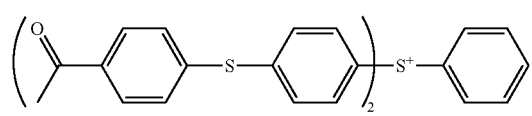
(b1-5)
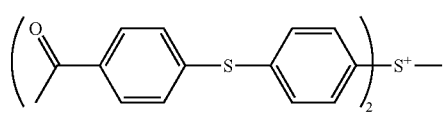
(b1-6)
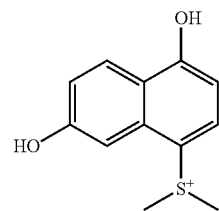
(b1-7)
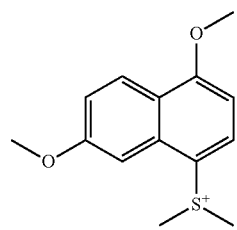
(b1-8)
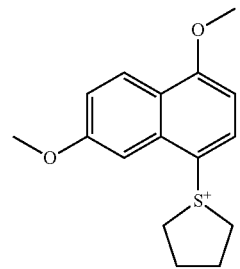
(b1-9)
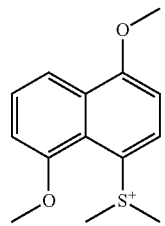
(b1-10)
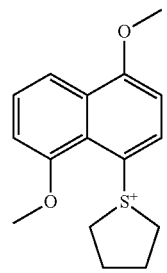
(b1-11)
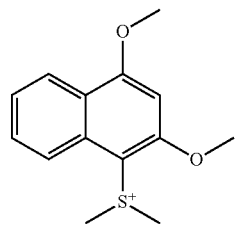
(b1-12)
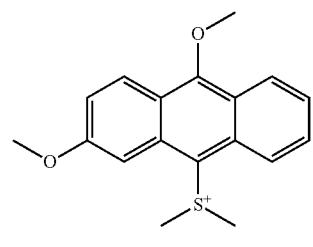
(b1-13)
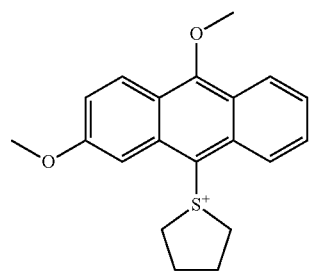
(b1-14)

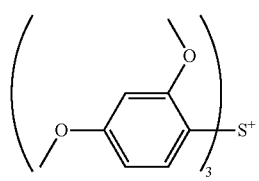
(b1-15)
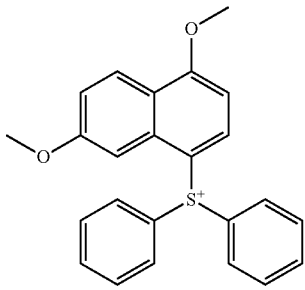
(b1-16)
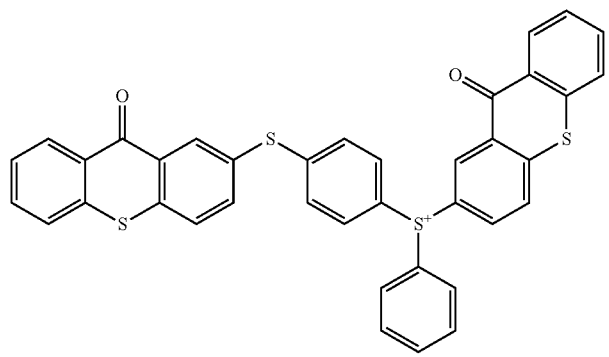
(b1-17)
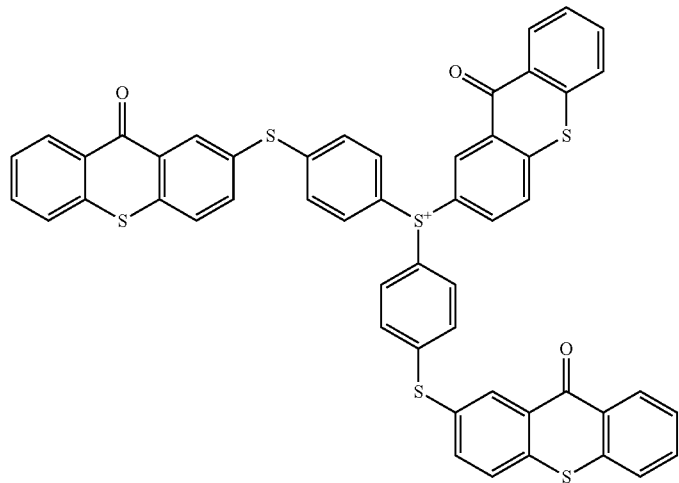
(b1-18)

-continued
(b1-19)
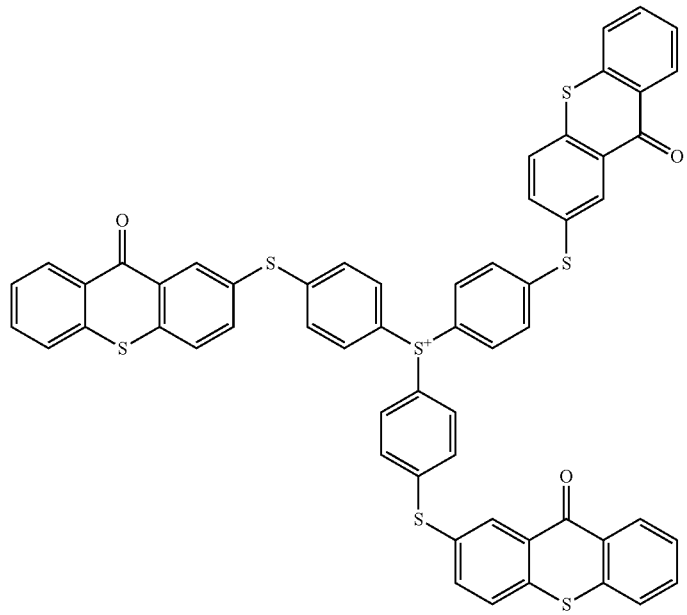
(b1-20)
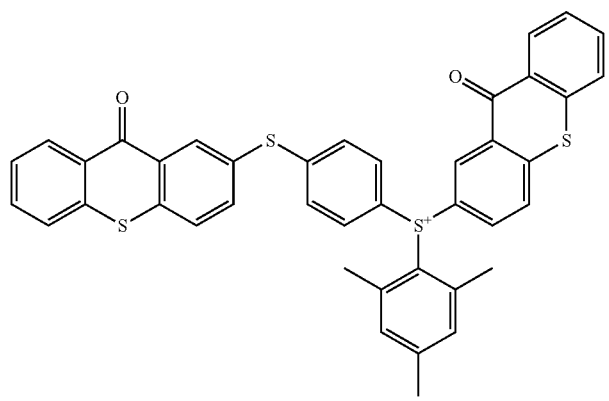
(b1-21)
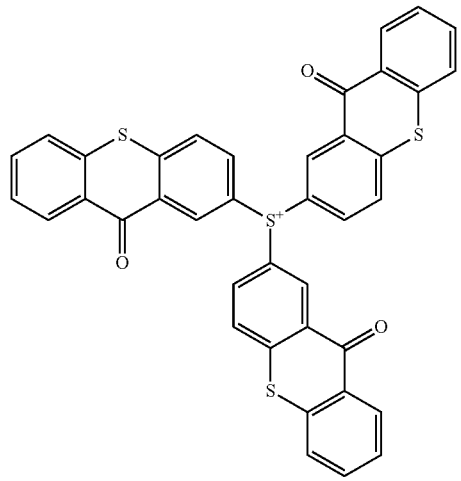

-continued
(b1-22)
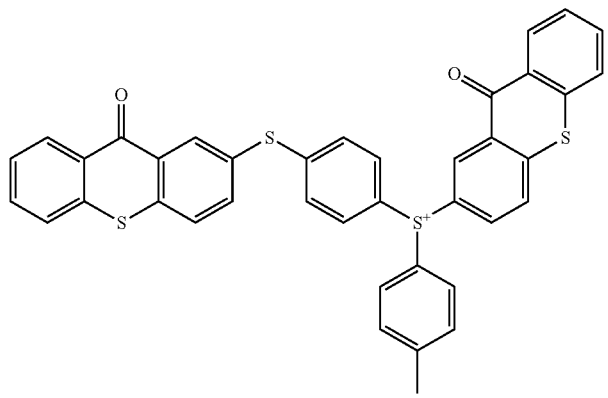
(b1-23)
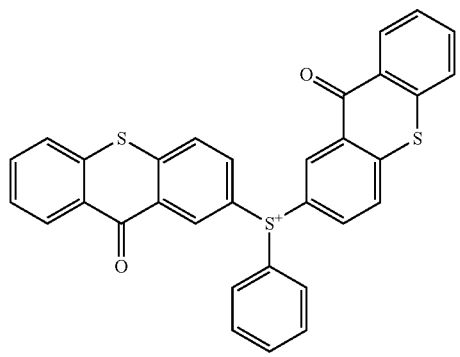
(b1-24)
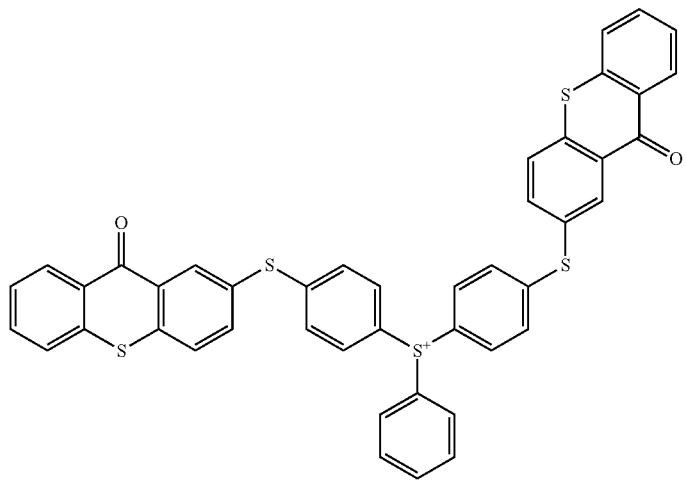
(b1-25)
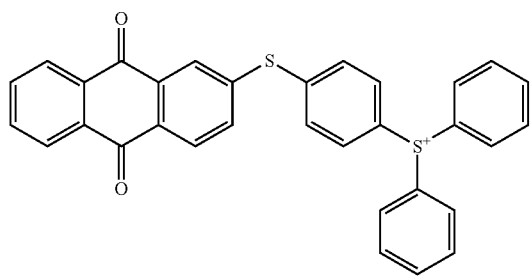
(b1-26)
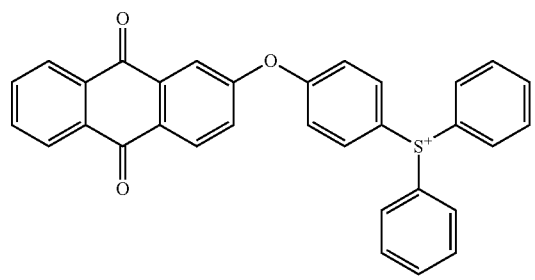

-continued
(b1-27)
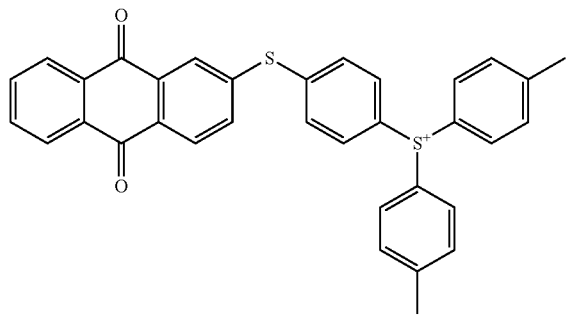
(b1-28)
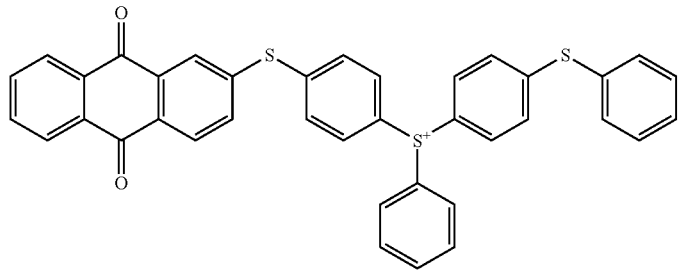
(b1-29)
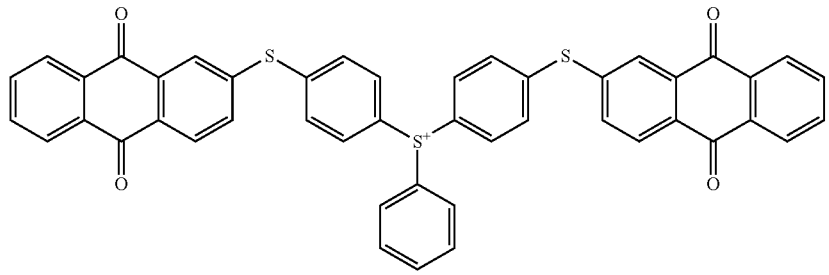
(b1-30)
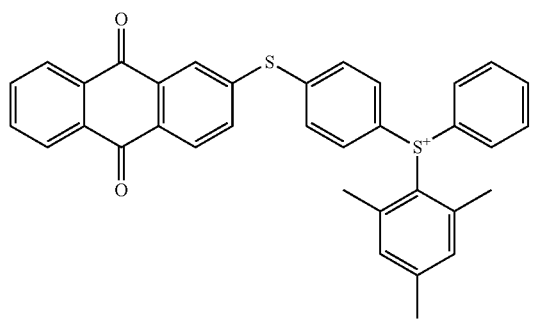
(b1-31)
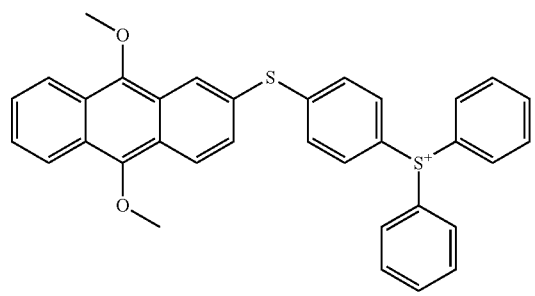
(b1-32)
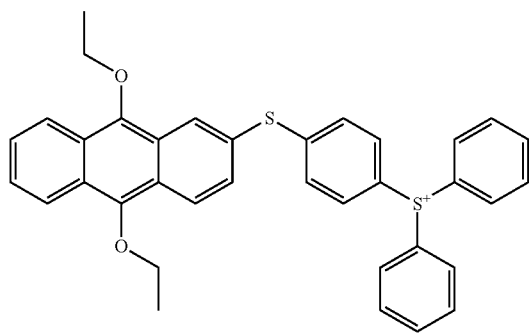
(b1-33)
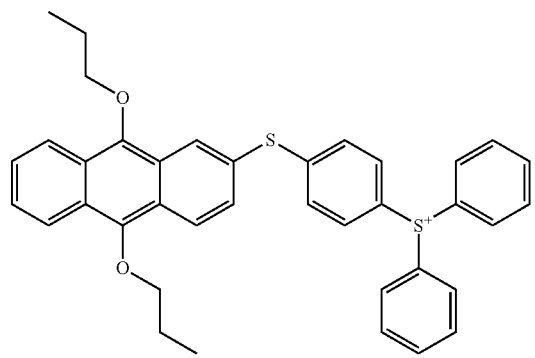

(b1-34)
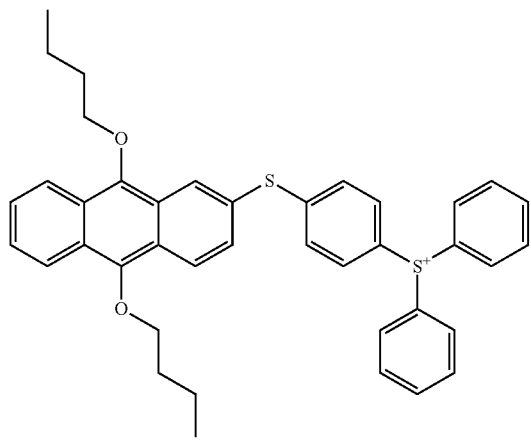
(b1-35)
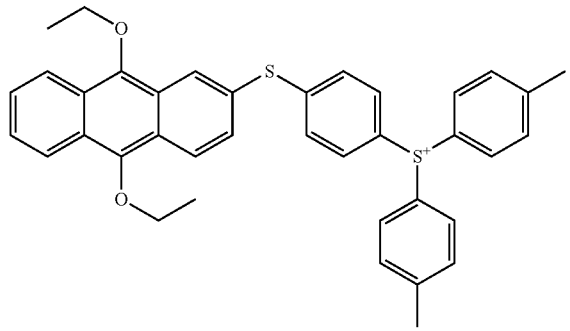
(b1-36)
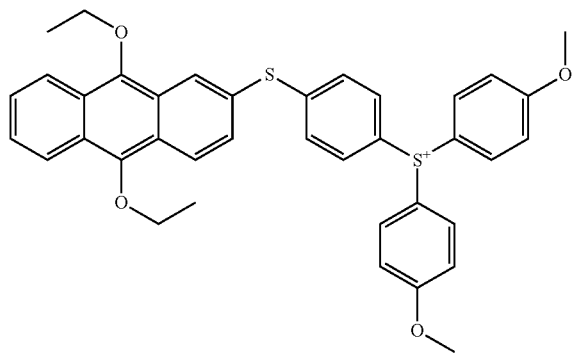
(b1-37)
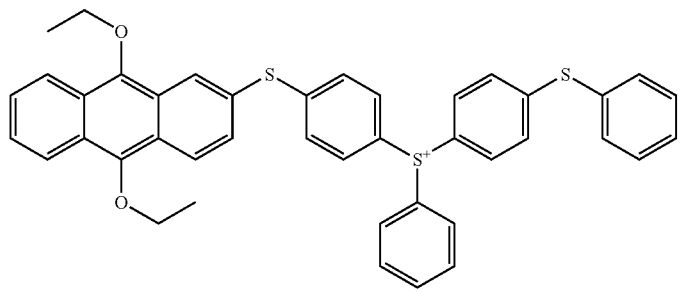

-continued
(b1-38)
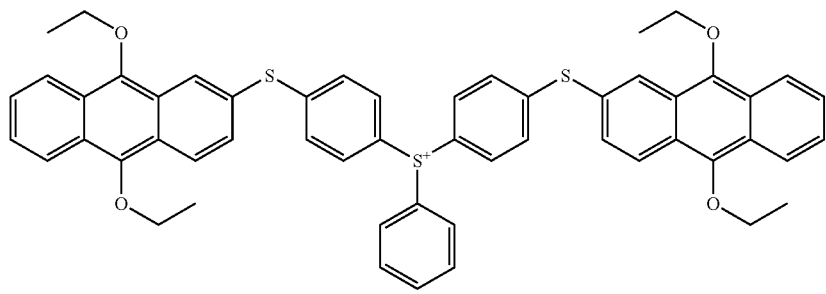
(b1-39)
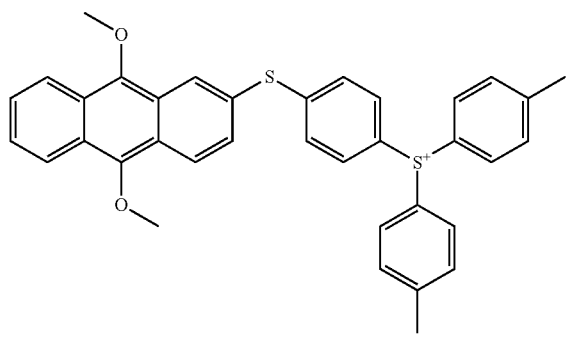
(b1-40)
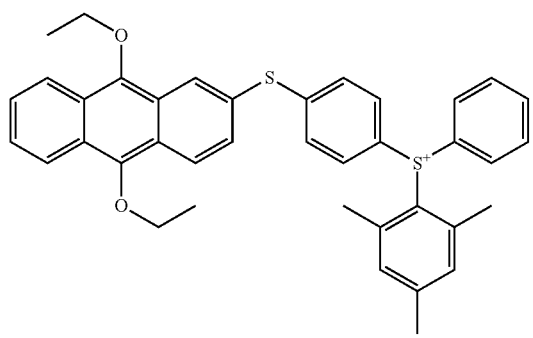
(b1-41)
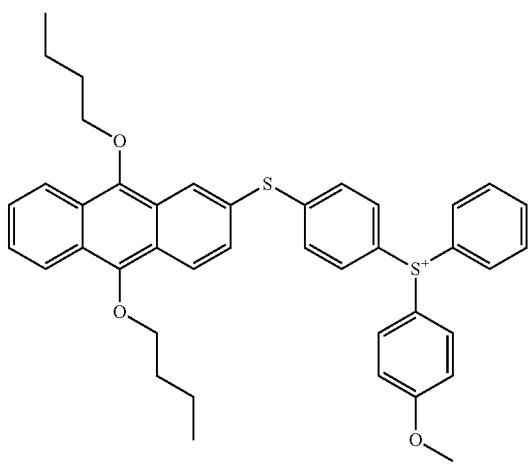
(b1-42)
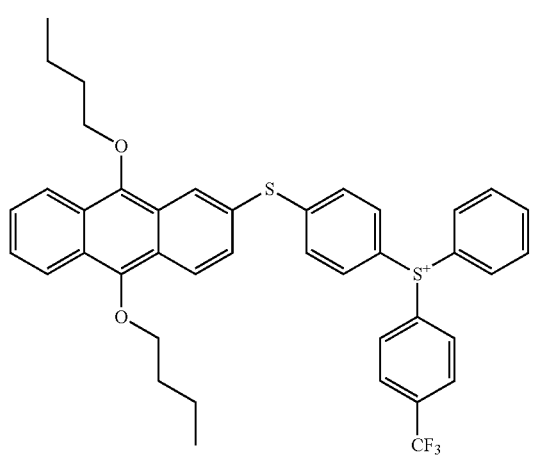

Among these, those containing a cyclic carbonyl structure are favorable from the viewpoint that they have high photosensitivity to the i-line, and examples of $R_1$ to $R_3$ containing the cyclic carbonyl structure include the above-mentioned (b1-17) to (b1-30). $R_1$ to $R_3$ more favorably contain a heterocyclic group containing a cyclic carbonyl structure, and specific examples of $R_1$ to $R_3$ containing the heterocyclic group containing the cyclic carbonyl structure include the above-mentioned (b1-17) to (b1-24). At least one of $R_1$ to $R_3$ favorably contains a cyclic carbonyl structure, and more favorably two or more of $R_1$ to $R_3$ contain a cyclic carbonyl structure. The carbonyl group is present in the conjugated system, thereby greatly contributing to the lengthening of the absorption wavelength of the first onium salt (b), and the conjugated system contains the aromatic ring, thereby improving the photosensitivity to the i-line in particular.

In the cation portion structure represented by (b1), it is only necessary to include at least two oxygen atoms in all the constituent atoms of $R_1$ to $R_3$ as described above, and one or two of $R_1$ to $R_3$ may have a structure containing no oxygen atom. Examples of structures that $R_1$ to $R_3$ may take are described below. In the cation portion structure represented by (b1), $R_1$ to $R_3$ are each, for example, an aryl group having 6 to 30 carbon atoms in total, a heterocyclic group having 4 to 30 carbon atoms in total, an alkyl group having 1 to 30 carbon atoms in total, an alkenyl group having 2 to 30 carbon atoms in total or an alkynyl group having 2 to 30 carbon atoms in total. These groups may be substituted by at least one selected from the group consisting of, for example, respective groups of alkyl groups, a hydroxyl group, cycloalkyl groups, alkenyl groups, alkynyl groups, alkoxy groups, alkylcarbonyl groups, arylcarbonyl groups, alkoxy-carbonyl groups, aryloxycarbonyl groups, arylthio-carbonyl groups, acyloxy groups, arylthio groups, alkylthio groups, aryl groups, heteroatom-containing aromatic ring groups, aryloxy groups, alkylsulfinyl groups, arylsulfinyl groups, alkylsulfonyl groups, arylsulfonyl groups, alkyleneoxy groups, an amino group, a cyano group and a nitro group, and halogen atoms. More specifically, examples of these substituents include respective groups of alkyl groups (for example, methyl, ethyl, propyl, isopropyl and butyl groups) having 1 to 6 carbon atoms, a hydroxyl group, cycloalkyl groups (for example, cyclopropyl, cyclobutyl, cyclopentyl and cyclohexyl groups) having 3 to 6 carbon atoms, alkenyl groups (for example, vinyl, 1-propenyl, 2-propenyl and 2-butenyl groups) having 2 to 6 carbon atoms, alkynyl groups (for example, acetylenyl, 1-propinyl, 2-propinyl and 2-butynyl groups) having 2 to 6 carbon atoms, alkoxy groups (for example, methoxy, ethoxy, n-propoxy, isopropoxy, n-butoxy and tert-butoxy groups) having 1 to 6 carbon atoms, alkylcarbonyl groups having 2 to 6 carbon atoms, arylcarbonyl groups having 7 to 11 carbon atoms, alkoxycarbonyl groups (for example, methoxycarbonyl, ethoxycarbonyl and tert-butoxycarbonyl groups) having 2 to 6 carbon atoms, aryloxycarbonyl groups having 7 to 11 carbon atoms, arylthiocarbonyl groups having 7 to 11 carbon atoms, acyloxy groups having 2 to 6 carbon atoms, arylthio groups (for example, phenylthio and naphthylthio groups) having 6 to 10 carbon atoms, alkylthio groups (for example, methylthio, ethylthio, n-propylthio, isopropylthio, n-butylthio and tert-butylthio groups) having 1 to 6 carbon atoms, aryl groups (for example, phenyl, naphthyl and anthracenyl groups) having 6 to 14 carbon atoms, heteroatom-containing aromatic ring groups (for example, furyl and thienyl groups) having 4 to 8 carbon atoms, aryloxy groups (for example, phenoxy and naphthoxy groups) having 6 to 10 carbon atoms, alkylsulfinyl groups having 1 to 6 carbon atoms, arylsulfinyl groups having 6 to 10 carbon atoms, alkylsulfonyl groups having 1 to 6 carbon atoms, arylsulfonyl groups having 6 to 10 carbon atoms, alkyleneoxy groups having 1 to 6 carbon atoms, an amino group, a cyano group and a nitro group, and halogen atoms (for example, chlorine, bromine and fluorine atoms). $R_1$ to $R_3$ may be the same or different from one another. Two or more R groups of $R_1$ to $R_3$ may also be bonded directly or through —O—, —S—, —SO—, —SO$_2$—, —NH—, —NR$_a$—, —CO—, —C(=O)O—, —C(=O)NH—, an alkylene group having 1 to 3 carbon atoms or a phenylene group to each other to form a ring structure. Here, $R_a$ is an alkyl group having 1 to 5 carbon atoms or an aryl group having 6 to 10 carbon atoms. Incidentally, the alkyl group in the present specification includes a linear chain, branched chain or cyclic chain.

Favorable specific examples of the anion portion structure represented by (b2) are mentioned below.

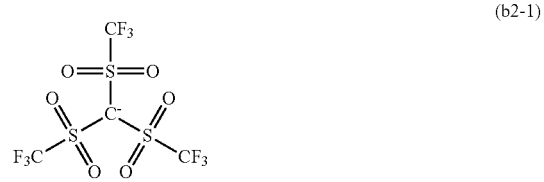
(b2-1)

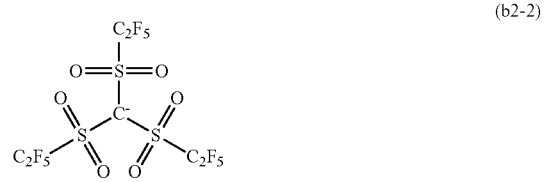
(b2-2)

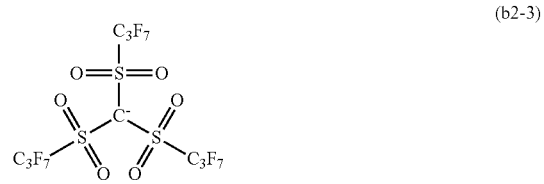
(b2-3)

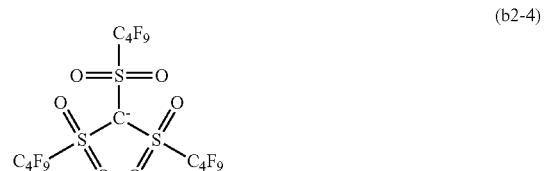
(b2-4)

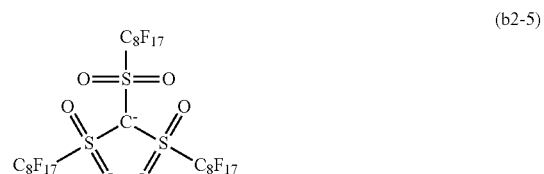
(b2-5)

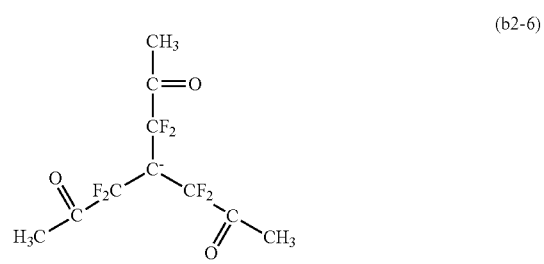
(b2-6)

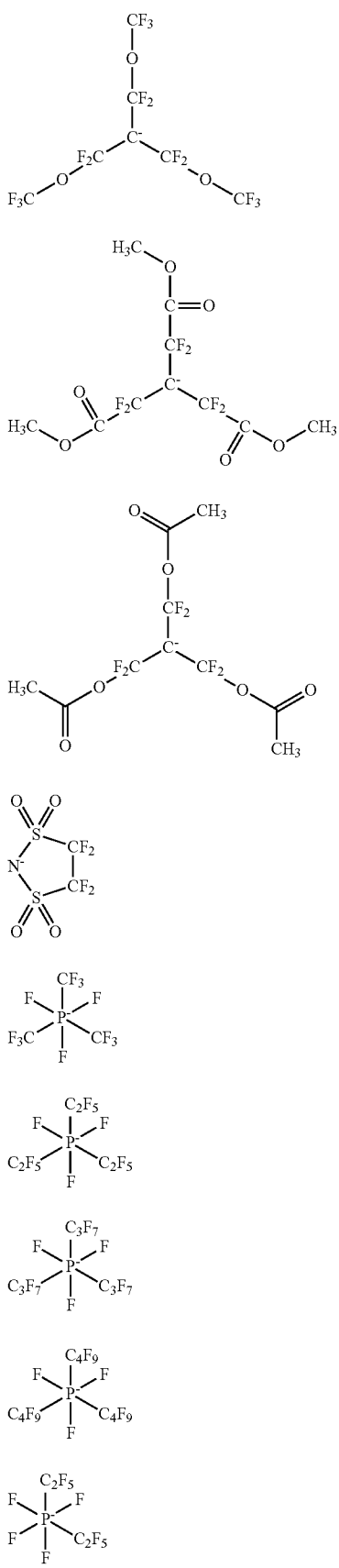

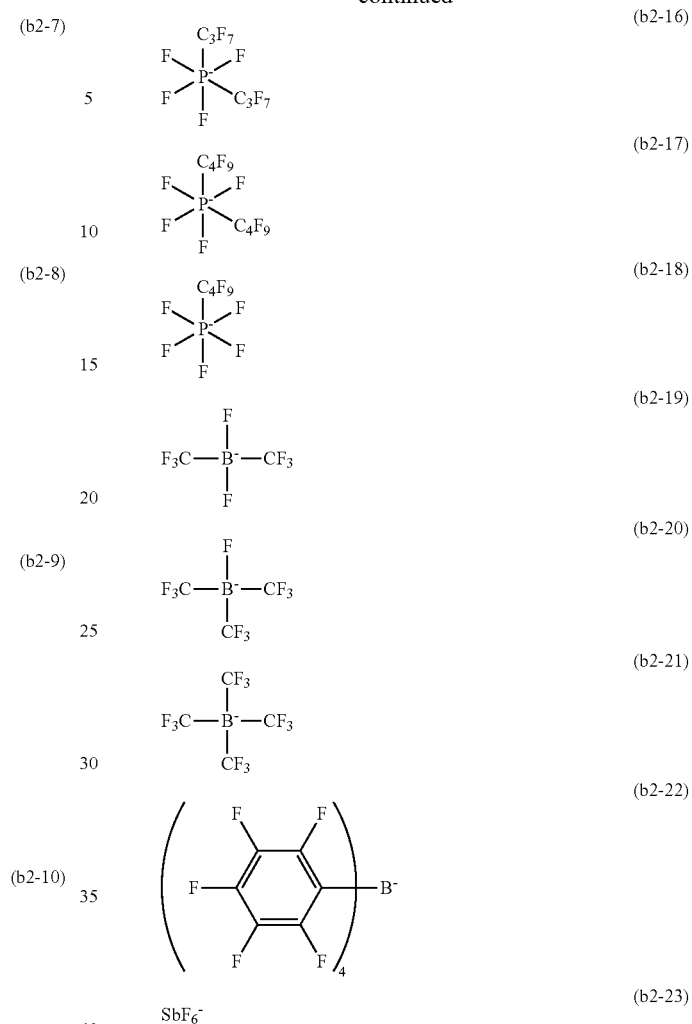

In the anion portion structure represented by (b2), $R_4$ is favorably a hydrocarbon group having at least one fluorine atom when n is 0 and Y is $-S(=O)_2-$ or a single bond. When m is 2 or more, any carbon atom of one $R_4$ and any carbon atom of another $R_4$ may also be bonded through a single bond to each other to form a ring structure. $R_4$ is, for example, an alkyl or aryl group which may be substituted by a fluorine atom.

In the anion portion structure represented by (b2), X is favorably a phosphorus atom, and specific examples of such a structure include the above-mentioned (b2-11) to (b2-18). In the case of the Lewis acid system, i.e., case where X is an antimony or phosphorus atom, a cured film formed tends to have excellent heat resistance. In the case where X is a phosphorus atom, a metal-corroding tendency is less than the case where X is antimony atom.

The component (b) may be used singly or in a combination of 2 or more thereof.

The content of the component (b) is favorably 0.01 parts by mass or more, more favorably 0.1 parts by mass or more per 100 parts by mass of the photosensitive negative resin composition. The content is favorably 20 parts by mass or less, more favorably 10 parts by mass or less.

(C) Second Onium Salt:

The second onium salt (hereinafter also abbreviated as component (c)) is composed of a one-to-one combination of a cation portion structure represented by (c1) and an anion portion structure represented by (c2) that are respectively specific structures.

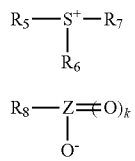
(c1)
(c2)

In the cation portion structure represented by (c1), $R_5$ to $R_7$ are, independently of one another, an organic group which may be substituted and has 1 to 15 carbon atoms, with the proviso that at most one oxygen atom is included in all the constituent atoms of $R_5$ to $R_7$.

In the anion portion structure represented by (c2), Z is selected from a carbon atom and a sulfur atom. k is 1 when Z is the carbon atom, or k is 2 when Z is the sulfur atom. $R_8$ is a hydrocarbon group which may contain a heteroatom and has 1 to 20 carbon atoms.

In the present invention, it is important that the second onium salt (c) is contained in addition to the first onium salt (b). The reason for this is as follows. As described above, the acid (b2) generated from the first onium salt (b) after exposure to the i-line is a strong acid and initiates and accelerates the cationic polymerization reaction of the epoxy groups, and so the component (b) is suitable for photosensitization in this point. On the other hand, when the acid (b2) diffuses into the photosensitive negative resin composition, an unexposed portion which will becomes an ejection orifice is cured, and it may thus be difficult in some cases to stably form an ejection orifice form. Thus, the second onium salt (c) composed of the cation portion structure represented by (c1) and the anion portion structure represented by (c2) is used in the present invention. In particular, supposing an acid with a proton imparted to the anion portion structure represented by (c2), the anion portion structure represented by (c2) has a structure of a weak acid that cannot cause epoxy polymerization or is very low in acidity to cause the polymerization. Accordingly, when the acid (b2) generated from the first onium salt (b) meets the second onium salt (c), salt exchange occurs, and the acid is converted to a weak acid that cannot cause epoxy polymerization or is hard to cause the polymerization. In short, the second onium salt (c) can function as a good quencher for the acid accelerating the epoxy polymerization in the epoxy polymerization. The feature of the cation portion structure represented by (c1) resides in that the photosensitivity to the i-line is low due to the structure that at most one oxygen atom is included in all the constituent atoms of $R_5$ to $R_7$. It can thereby be inhibited that the second onium salt (c) is sensitized to light upon exposure. As described above, the first onium salt and the second onium salt synergistically act in the present invention, whereby a fine structure which gives less dispersion and excellent reproducibility of a three-dimensional form can be stably formed.

Examples of (c1) and (c2) are mentioned below.

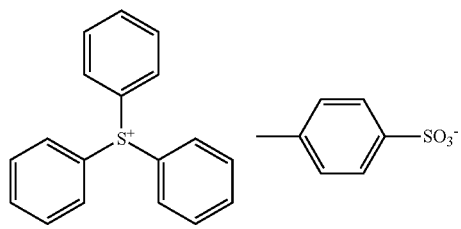

In the cation portion structure represented by (c1), $R_5$ to $R_7$ are each, for example, an aryl group having 6 to 15 carbon atoms in total or an alkyl group having 1 to 15 carbon atoms in total. These groups may be substituted by at least one selected from the group consisting of, for example, respective groups of alkyl groups, fluoroalkyl groups, a hydroxyl group, cycloalkyl groups, alkoxy groups, alkylcarbonyl groups, arylcarbonyl groups, arylthio groups, alkylthio groups, aryl groups and aryloxy groups, and halogen atoms. More specifically, examples of these substituents include respective groups of alkyl groups (for example, methyl, ethyl, propyl, isopropyl and butyl groups) having 1 to 6 carbon atoms, fluoroalkyl groups (for example, trifluoromethyl and pentafluoroethyl groups) having 1 to 6 carbon atoms, a hydroxyl group, cycloalkyl groups (for example, cyclopropyl, cyclobutyl, cyclopentyl and cyclohexyl groups) having 3 to 6 carbon atoms, alkoxy groups (for example, methoxy, ethoxy, n-propoxy, isopropoxy, n-butoxy and tert-butoxy groups) having 1 to 6 carbon atoms, alkylcarbonyl groups having 2 to 6 carbon atoms, arylcarbonyl groups having 7 to 11 carbon atoms, arylthio groups (for example, phenylthio and naphthylthio groups) having 6 to 10 carbon atoms, alkylthio groups (for example, methylthio, ethylthio, n-propylthio, isopropylthio, n-butylthio and tert-butylthio groups) having 1 to 6 carbon atoms, aryl groups (for example, phenyl and naphthyl groups) having 6 to 10 carbon atoms and aryloxy groups (for example, phenoxy and naphthoxy groups) having 6 to 10 carbon atoms, and halogen atoms (for example, chlorine, bromine and fluorine atoms). $R_5$ to $R_7$ may be the same or different from one another. Two or more R groups of $R_5$ to $R_7$ may also be bonded directly or through an alkylene group having 1 to 3 carbon atoms or a phenylene group to each other to form a ring structure.

Favorable specific examples of the cation portion structure represented by (c1) are mentioned below.

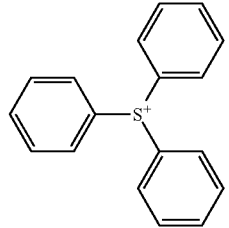
(c1-1)

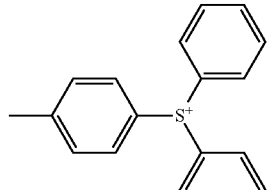
(c1-2)

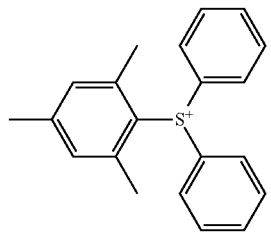
(c1-3)

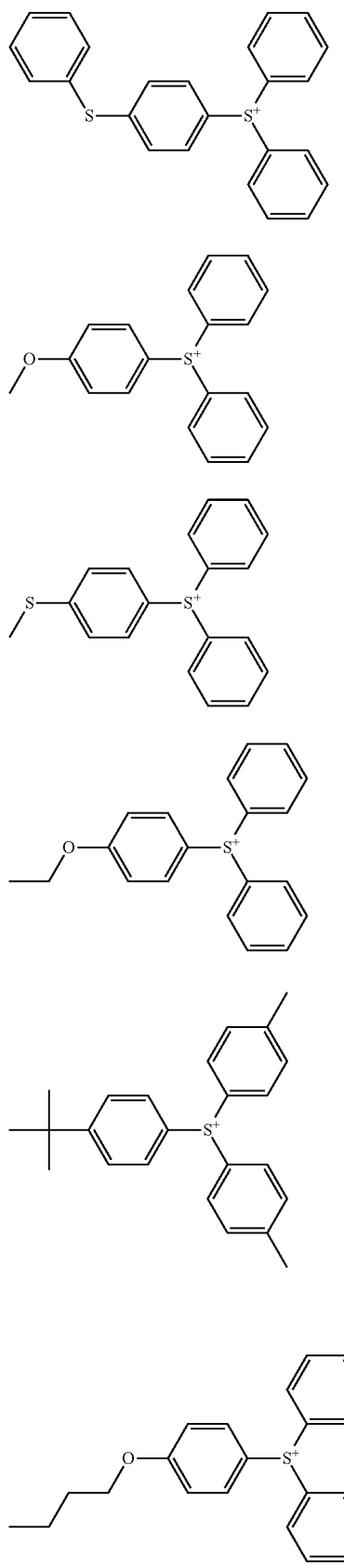
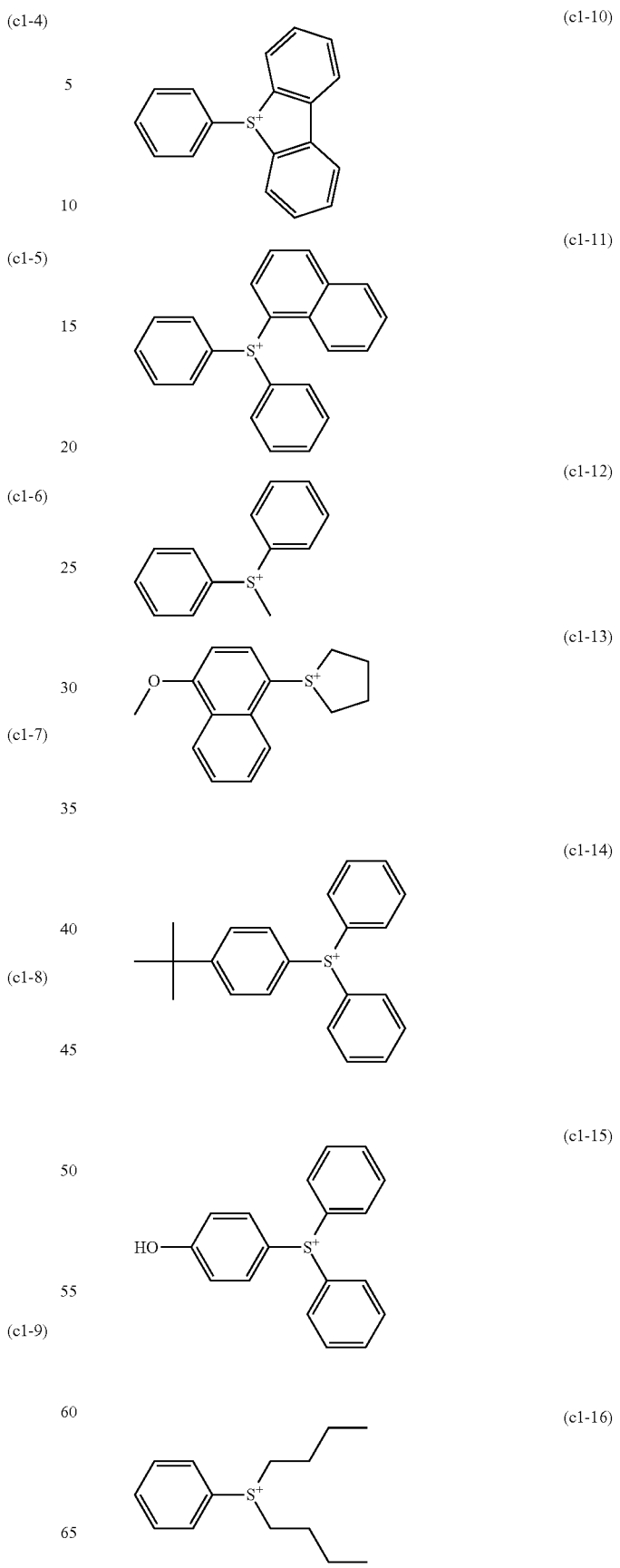

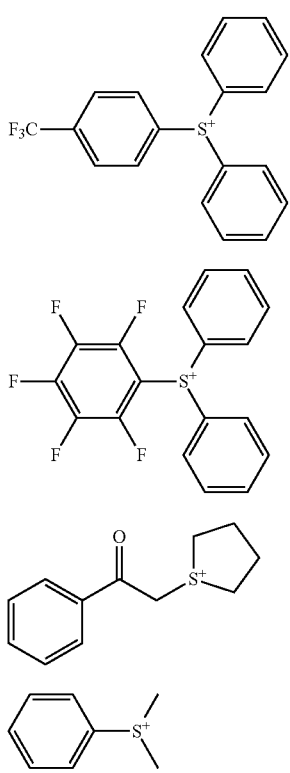

(c1-17)

(c1-18)

(c1-19)

(c1-20)

In the anion portion structure represented by (c2), $R_8$ is, for example, an alkyl group having 1 to 20 carbon atoms in total or an aryl group having 6 to 20 carbon atoms in total. These groups may be substituted by at least one selected from the group consisting of, for example, alkyl groups, an oxo group, cycloalkyl groups, alkoxy groups and alkylcarbonyl groups. More specifically, examples of these substituents include alkyl groups (for example, methyl, ethyl, propyl, isopropyl and butyl groups) having 1 to 10 carbon atoms, cycloalkyl groups (for example, cyclopropyl, cyclobutyl, cyclopentyl and cyclohexyl groups) having 3 to 6 carbon atoms, alkoxy groups (for example, methoxy, ethoxy, n-propoxy, isopropoxy, n-butoxy and tert-butoxy groups) having 1 to 6 carbon atoms, alkylcarbonyl groups having 2 to 6 carbon atoms. Two or more carbon atoms of $R_8$ may also be bonded directly or through an alkylene group having 1 to 3 carbon atoms to each other to form a ring structure. The ring structure may be monocyclic or polycyclic.

Favorable specific examples of the anion portion structure represented by (c2) are mentioned below.

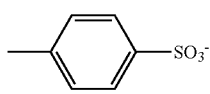
(c2-1)

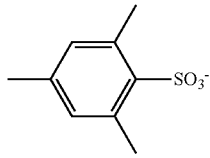
(c2-2)

(c2-3)

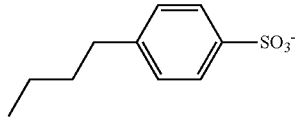
(c2-4)

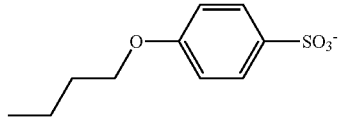
(c2-5)

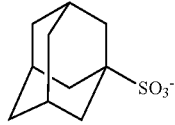
(c2-6)

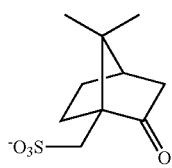
(c2-7)

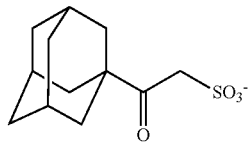
(c2-8)

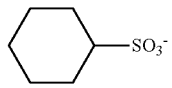
(c2-9)

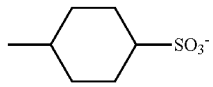
(c2-10)

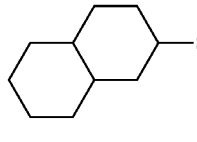
(c2-11)

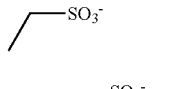
(c2-12)

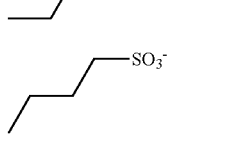
(c2-13)

(c2-14)

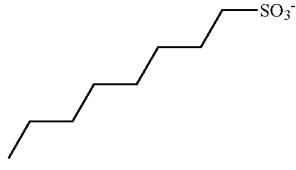
(c2-15)

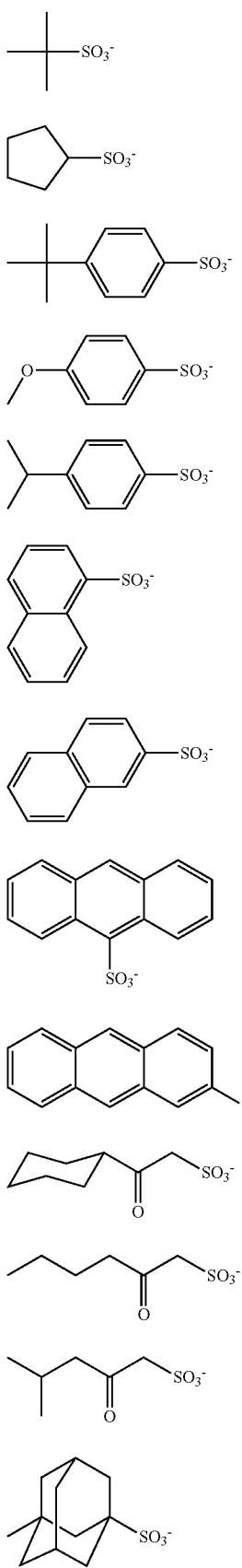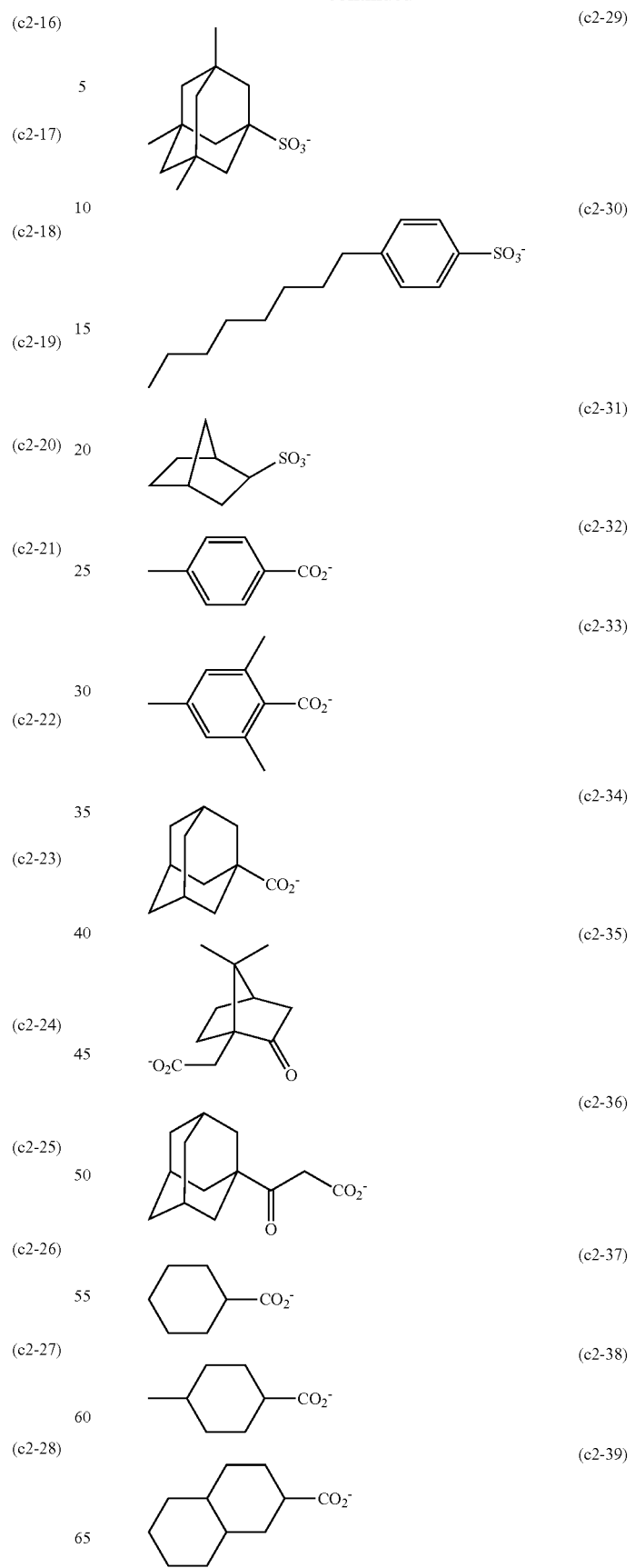

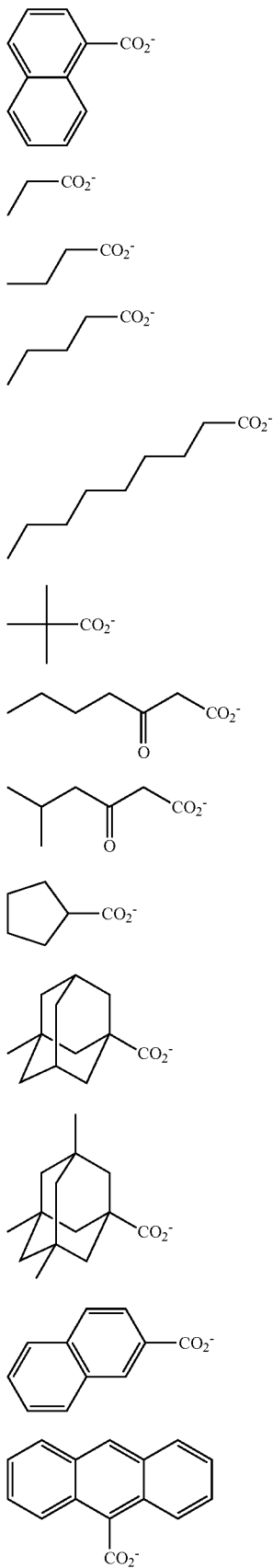
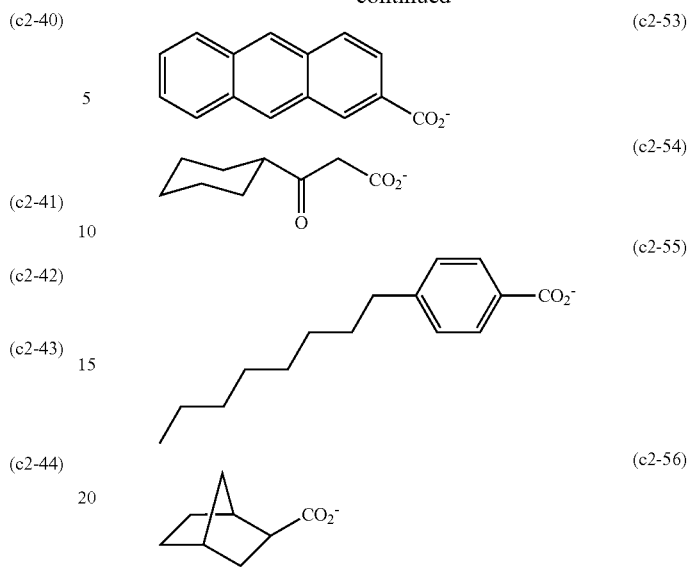

In the anion portion structure represented by (c2), $R_8$ is favorably an aromatic hydrocarbon- or alicyclic hydrocarbon-containing structure. When $R_8$ is the aromatic hydrocarbon- or alicyclic hydrocarbon-containing structure, it is inhibited due to its bulkiness and carbon density that an acid generated from the anion represented by (c2) is volatilized during a heating process and vaporized off in an atmospheric environment. Specific examples of the anion portion structure having $R_8$ containing the aromatic hydrocarbon or alicyclic hydrocarbon include the above-mentioned (c2-1) to (c2-11), (c2-17) to (c2-25), (c2-28) to (c2-40), and (c2-48) to (c2-56).

In the anion portion structure represented by (c2), Z is favorably a sulfur atom. When Z is the sulfur atom, the anion can be more stabilized compared with the case where Z is the carbon atom. Therefore, the nucleophilicity of the anion portion can be inhibited to inhibit the decomposition of the second onium salt caused by the anion portion nucleophilically attacking the cation portion of (c1).

The component (c) may be used singly or in a combination of 2 or more thereof.

The content of the component (c) is favorably 0.001 parts by mass or more per 100 parts by mass of the photosensitive negative resin composition. The content is favorably 5 parts by mass or less, more favorably 4 parts by mass or less.

The amounts of the component (b) and the component (c) incorporated into the photosensitive negative resin composition favorably satisfy the following relationship.

The number of moles of the first onium salt (b)>The number of moles of the second onium salt (c)

When this relationship is satisfied, a state where the amount of the component (b) generating the acid effective for the epoxy polymerization is more than the amount of the component (c) functioning as a quencher is created, whereby high photosensitization can be achieved.

The both components also favorably satisfy the following relationship.

[The number of moles of the first onium salt (b)]×
0.7>The number of moles of the second onium
salt (c)>[The number of moles of the first onium
salt (b)]×0.02

The amount of the second onium salt (c) added is increased to make the number of moles of the second onium salt (c) greater than [The number of moles of the first onium salt (b)]×0.02, whereby the effect of the second onium salt as the quencher can be sufficiently achieved.

The photosensitive negative resin composition according to the present invention may also contain a third onium salt in addition to the first onium salt (b) and the second onium salt (c). Examples of the third onium salt include those containing the cation portion structure represented by (c1) and the anion portion structure represented by (b2). In this case, the content of the third onium salt is favorably, for example, 0.001 parts by mass or more, more favorably 0.005 parts by mass or more per 100 parts by mass of the photosensitive negative resin composition. The content is favorably 25 parts by mass or less, more favorably 15 parts by mass or less.

As described above, the photosensitive negative resin composition according to the present invention is used, whereby a fine structure which gives less dispersion and excellent reproducibility of a three-dimensional form can be stably formed. The photosensitive negative resin composition according to the present invention is excellent in the reproducibility when a photolithographic process using the i-line is applied thereto in particular.

A nitrogen-atom-containing organic compound, particularly, an amine compound may be used in some cases as a quencher for acid. However, when such an epoxy-group-containing compound as used in the present invention is mixed with the amine compound, the amine compound functions as a curing agent, and curing may proceed in some cases in a dark reaction. Therefore, it is difficult to store the amine compound in a state of being mixed with such an epoxy-group-containing compound as used in the present invention for a long period of time. On the other hand, the component (c) of the present invention generates extremely small dark reactions even when mixed with the epoxy-group-containing compound, so that it is possible to store the component (c) in a state of being mixed with the epoxy-group-containing compound for a long period of time.

Production Method:

For example, a liquid ejection head can be formed by using the photosensitive negative resin composition according to the present invention. No particular limitation is imposed on the liquid ejection head. However, an ink jet recording head is mentioned as an example thereof.

Figure 2:
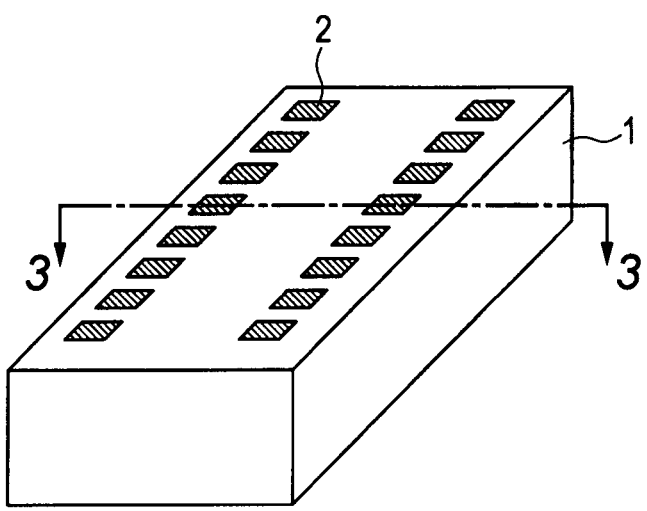
FIG. 2 schematically illustrates a substrate having energy generating elements.

FIG. 1 is a typical perspective view illustrating the construction of an exemplary ink jet recording head. The ink jet recording head illustrated in FIG. 1 has a flow-path-forming layer 4 forming ink ejection orifices (ejection orifices) 5 and an ink flow path (liquid flow path) 3c communicating with the ink ejection orifices 5 on a substrate having a plurality of energy-generating elements 2. An ink supply port (liquid supply port) 6 for supplying an ink (liquid) to the ink flow path 3c is provided in the substrate 1. As illustrated in FIG. 2, a plurality of the energy-generating elements 2 are arranged at a predetermined pitch on the substrate 1.

A production method of the ink jet recording head will hereinafter be described with reference to FIGS. 3A to 3F and FIGS. 4A to 4F. FIGS. 3A to 3F and FIGS. 4A to 4F correspond to sectional views taken along line 3-3 in FIGS. 1 and 2. Incidentally, the production methods illustrated in FIGS. 3A to 3F and FIGS. 4A to 4F are referred to as Production Method 1 and Production Method 2, respectively.

Incidentally, a control signal input electrode (not illustrated) for operating the element is connected to each energy-generating element 2.

Figure 3A:
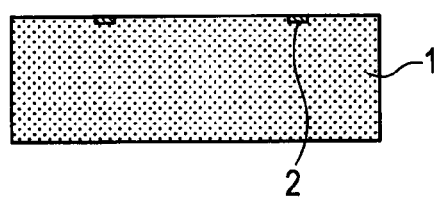
FIGS. 3A, 3B, 3C, 3D, 3E and 3F are schematic process drawings for illustrating an exemplary process for forming a fine structure using a photosensitive negative resin composition according to an embodiment.

Production Method 1:

A substrate 1 having energy-generating elements 2 is first provided as illustrated in FIG. 3A.

The substrate 1 is favorably an Si substrate, particularly favorably a silicon single crystal. When a through-hole is provided in the substrate 1 by anisotropic etching, the substrate is favorably a silicon single crystal having the crystal orientation <100>. When a through-hole is provided in the substrate 1 by dry etching, sand blasting or laser machining, the substrate may be a silicon single crystal having the crystal orientation <110>.

No particular limitation is imposed on the energy-generating elements 2 so far as election energy for ejecting an ink droplet can be given to the ink to eject the ink droplet from the ejection orifice. For example, when heating resistor elements are used as the energy-generating elements, the heating resistor element heats an ink present in the vicinity thereof, thereby causing the ink to bring about a change of state to generate ejection energy.

Figure 3B:
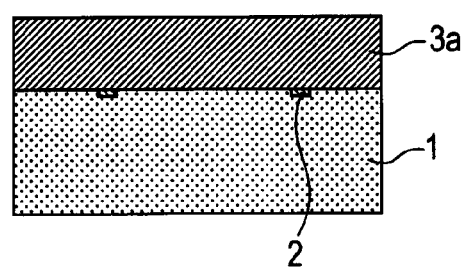

A soluble resin composition is then applied on to the substrate 1 to form a soluble resin layer 3a for ink flow path pattern as illustrated in FIG. 3B.

As a method for forming the soluble resin layer 3a, for example, a positive photosensitive resin is suitably dissolved in a solvent, and the solution is applied on to the substrate 1 by a spin coating method. Thereafter, the solution applied is heated, whereby the soluble resin layer 3a can be formed. No particular limitation is imposed on the thickness of the soluble resin layer 3a so far as it corresponds to a desired height of the ink flow path. However, the thickness is favorably, for example, 2 to 50 μm.

Figure 3C:
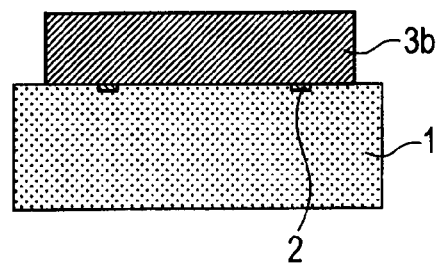

The soluble resin layer 3a is then irradiated with radiation and developed, thereby forming an ink flow path pattern 3b as illustrated in FIG. 3C.

The photosensitive negative resin composition according to the present invention is then arranged on the ink flow path pattern 3b and the substrate 1 to form a flow-path-forming layer 4.

The thickness of the flow-path-forming layer 4 is favorably 2 μm or more in terms of the thickness on the ink flow path pattern 3b. No particular limitation is imposed on the upper limit of this thickness. However, the upper limit is, for example, 100 μm or less in terms of the thickness on the ink flow path pattern 3b in view of the developability of ink ejection orifice portions.

Figure 3D:
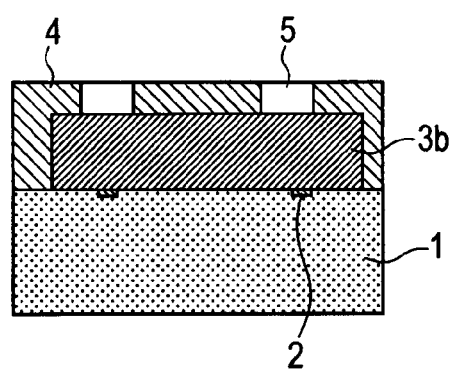

The flow-path-forming layer 4 is then irradiated with the i-line and developed with MIBK (methyl isobutyl ketone) to conduct a patterning treatment. A rinsing treatment with IPA is then conducted, thereby forming ink ejection orifices 5 (FIG. 3D).

The center wavelength of the i-line is 365 nm.

Figure 3E:
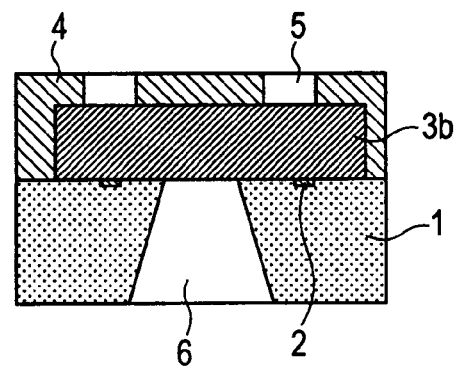

An ink supply port 6 is then formed by means of a proper method such as an etching treatment as illustrated in FIG. 3E.

Figure 3F:
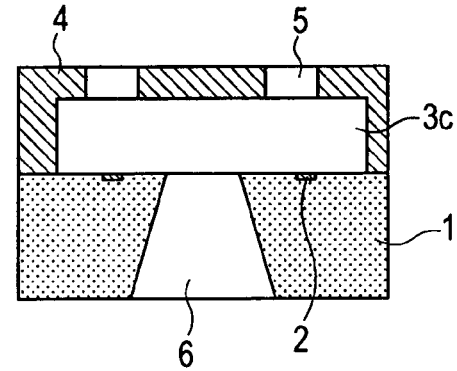

The ink flow path pattern 3b is then dissolved out with a proper solvent as illustrated in FIG. 3F.

As the solvent, may be used, for example, an aqueous alkali solution or an organic solvent.

Thereafter, the substrate 1 is cut and separated into chips by a dicing saw, and electrical junction for driving the energy-generating elements 2 is formed. In addition, a chip tank member for supplying an ink is connected to complete an ink jet recording head.

Incidentally, the above-described method is also useful as a pattern-forming method for forming a hollow pattern without being limited to the production method of the ink jet recording head.

Figure 4A:
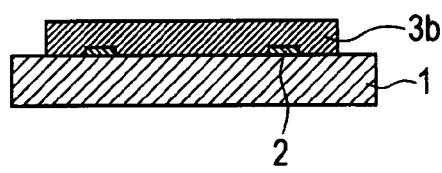
FIGS. 4A, 4B, 4C, 4D, 4E and 4F are schematic process drawings for illustrating another exemplary process for forming the fine structure using the photosensitive negative resin composition according to an embodiment.

Production Method 2:

A soluble resin composition is first applied on to a substrate 1 to form an ink flow path pattern 3b as illustrated in FIG. 4A.

Figure 4B:
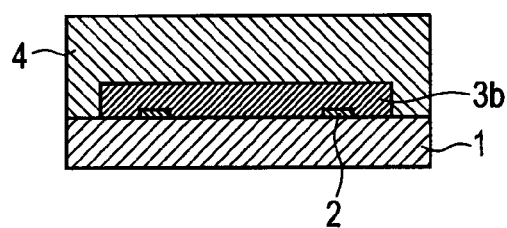

A flow-path-forming layer 4 formed of the photosensitive negative resin composition according to the present invention is then formed on the ink flow path pattern 3b and the substrate 1 as illustrated in FIG. 4B.

Figure 4C:
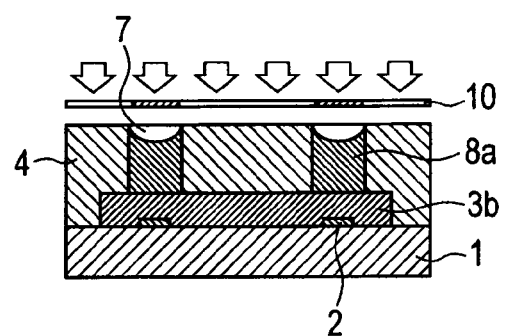

The flow-path-forming layer 4 is then irradiated with the i-line through a first photomask 10 as illustrated in FIG. 4C. When post first exposure baking is conducted for this flow-path-forming layer, surface recesses 7 and first ejection orifice patterns 8a that are latent images of ejection orifices are formed. No particular limitation is imposed on the conditions for the post first exposure baking. However, this baking is, for example, a heat treatment for 4 minutes at 100° C.

Figure 4D:
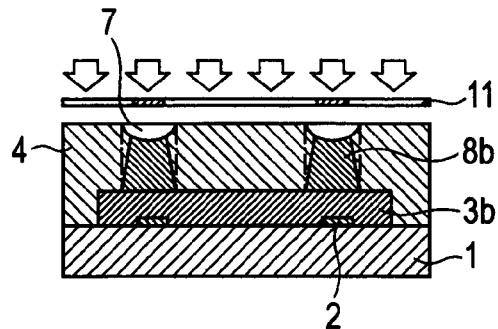

The flow-path-forming layer 4 is then irradiated again with the i-line through a second photomask 11 as illustrated in FIG. 4D. The second photomask 11 has opening portions different from the first photomask 10. At this time, at least part of unexposed portions after the first exposure are subjected to second exposure. When post second exposure baking is conducted for this flow-path-forming layer, second ejection orifice patterns 8b that are latent images of ejection orifices are newly formed. No particular limitation is imposed on the conditions for the post second exposure baking. However, this baking is, for example, a heat treatment for 4 minutes at 90° C.

The second photomask 11 includes circular or oval light-screening portions corresponding to an ejection orifice for forming ejection orifices. The first photomask 10, on the other hand, includes light-screening portions at the same positions as the light-screening portions for ejection orifices of the second photomask 11, and these light-screening portions each have an area larger than that of the second photomask 11 to cover the light-screening portion of the second photomask 11.

Figure 4E:
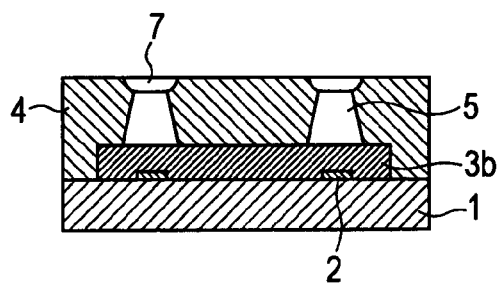

The flow-path-forming layer 4 is then developed with MIBK (methyl isobutyl ketone). In addition, a rinsing treatment is conducted with IPA, thereby forming ejection orifices 5 as illustrated in FIG. 4E.

Figure 4F:
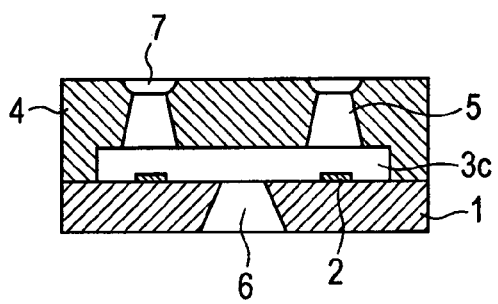

An ink supply port 6 is then formed by means of a proper method such as an etching treatment as illustrated in FIG. 4F. The ink flow path pattern 3b is then dissolved out with a proper solvent to form an ink flow path 3c.

Thereafter, the substrate 1 is cut and separated into chips by a dicing saw, and electrical junction for driving the energy-generating elements 2 is formed. In addition, a chip tank member for supplying an ink is connected to complete an ink jet recording head.

Incidentally, the above-described method is also useful as a pattern-forming method for forming a hollow pattern without being limited to the production method of the ink jet recording head.

EXAMPLES

The present invention will hereinafter be described by Examples. However, the present invention is not limited to these Examples.

Example 1

Components (a), (b) and (c) were mixed according to the formulation shown in Table 1, and propylene glycol monomethyl ether as a solvent was additionally mixed in an amount of 80 parts by mass per 100 parts by mass of the component (a) to obtain a photosensitive negative resin composition. In Table 1, the unit is part(s) by mass.

After this photosensitive negative resin composition was applied on to a substrate composed of a silicon wafer by a spin coater, prebaking and drying were conducted for 5 minutes at 90° C. to obtain a photosensitive resin composition layer having a thickness of 40 μm. After the prebaking, patterning exposure was conducted through a mask, in which a desired pattern had been formed, by means of FPA-3000 i5+ (i-line stepper; manufactured by Canon Inc.) according to the above-described Production Method 1 and Production Method 2, and a post exposure baking treatment was conducted for 4 minutes at 90° C. on a hot plate.

Incidentally, in Production Method 1, the thickness of the flow-path-forming layer 4 formed of the photosensitive negative resin composition was controlled to 20 μm in terms of the thickness on the ink flow path pattern 3b. In Production Method 2, the thickness of the flow-path-forming layer 4 formed of the photosensitive negative resin composition was controlled to 25 μm in terms of the thickness on the ink flow path pattern 3b.

In Production Method 1, the defocus setting of the i-line stepper was suitably changed, whereby a taper angle of, for example, about 0.1 to 10° can be achieved. This example was performed in such a manner that the taper angle was 5° in Production Method 1 and 10° in Production Method 2. Thereafter, CDS-860R+(manufactured by Canon Inc.) was used to conduct a development treatment. The resin pattern after the development was post-baked together with the substrate for 1 hour at 140° C. by means of an oven to obtain a cured resist pattern on the substrate.

Figure 5:
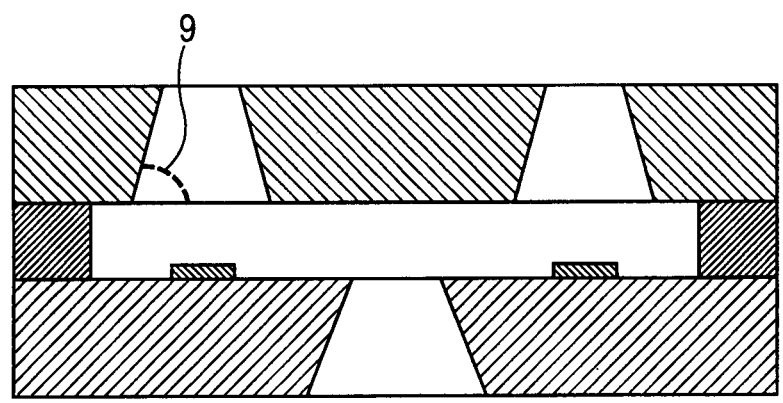
FIG. 5 is a schematic sectional view of the liquid ejection head illustrating a taper angle.

Evaluation:

A taper angle that 90 degrees—9 illustrated in FIG. 5 was calculated from a section photograph obtained by observing through SEM in a direction of the sectional view taken along line 3-3 in FIG. 1 or 2. The measurement was conducted on each of five ejection orifices in the same pattern. The value (%) obtained by calculating a difference between the average value of the five taper angles thus obtained and the value most different from the average value, dividing the difference calculated by the average value and multiplying this value by 100 was defined as the taper angle dispersion.

Examples 2 to 6, and 8

Photosensitive negative resin compositions were prepared in the same manner as in Example 1 except that components (a), (b) and (c) were used according to their corresponding formulations shown in Table 1, and the evaluation was made.

Exmple 7

A photosensitive negative resin composition was prepared in the same manner as in Example 1 except that components (a), (b), (c) and (d) were used according to the formulation shown in Table 1, and the evaluation was made. The component (d) is such that the cation portion structure is the following compound represented by c1-21, and the anion portion structure is b2-23.

(c1-21)

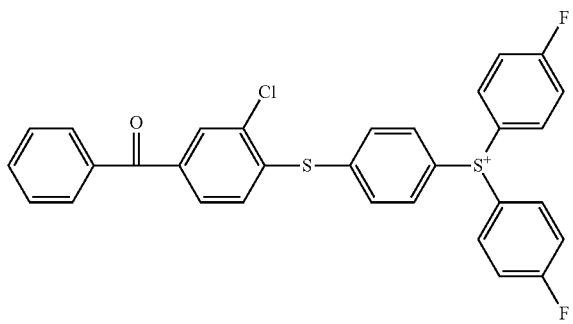 [SMILES: O=C(c1ccccc1)c1ccc(Sc2ccc([S+](c3ccc(F)cc3)c3ccc(F)cc3)cc2)c(Cl)c1]

Example 9

A photosensitive negative resin composition was prepared in the same manner as in Example 1 except that components (a), (b) and (c) and a sensitizer were used according to the formulation shown in Table 1, and the evaluation was made. As the sensitizer e-1, was used 1-naphthol.

Comparative Examples 1 and 2

Photosensitive negative resin compositions were prepared in the same manner as in Example 1 except that components (a) and (d) were used according to their corresponding formulations shown in Table 1, and the evaluation was made.

Comparative Example 3

A photosensitive negative resin composition was prepared in the same manner as in Example 1 except that components (a) and (b) were used according to the formulation shown in Table 1, and the evaluation was made.

Incidentally, Examples 1 to 9 and Comparative Example 3 all satisfy the relationship of "The number of moles of the first onium salt>The number of moles of the second onium salt".

In Examples 1 to 9, the respective photosensitive negative resin compositions containing the components (b) and (c) were used to determine the taper angle dispersion of the ejection orifices. As a result, the dispersion was 5% or less, and so high reproducibility was achieved.

On the other hand, in the photosensitive negative resin compositions of Comparative Examples 1 to 3, the taper angle dispersion was 10% to 15%, and so the reproducibility of the taper angle was insufficient.

INDUSTRIAL APPLICABILITY

From the above, the photosensitive negative resin compositions according to the present invention can reproduce the taper angle with good results and can stably form a fine structure which gives less dispersion and excellent reproducibility of a three-dimensional form. Accordingly, the photosensitive negative resin compositions according to the present invention can be suitably used in various devices subjected to microprocessing for MEMS.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-280474, filed Dec. 16, 2010, which is hereby incorporated by reference herein in its entirety.

REFERENCE SIGNS LIST

1 Substrate
2 Energy-generating elements
3a Soluble resin layer
3b Ink flow path pattern
3c Ink flow path
4 Flow-path-forming layer
5 Ejection orifices
6 Ink supply port
7 Surface recesses

TABLE 1

| | Mixed components | Example | | | | | | | | | Comparative Example | | |
|---|---|---|---|---|---|---|---|---|---|---|---|---|---|
| | | 1 | 2 | 3 | 4 | 5 | 6 | 7 | 8 | 9 | 1 | 2 | 3 |
| Component (a) | a-1 | 100 | — | — | 100 | 100 | — | — | — | — | 100 | 100 | 100 |
| | a-2 | — | 100 | 100 | — | — | 100 | — | — | — | — | — | — |
| | a-3 | — | — | — | — | — | — | 100 | 100 | 100 | — | — | — |
| Component (b) | b1-17/b2-11 | 2 | 2 | — | — | — | — | 1 | 2 | 1 | — | — | 2 |
| | b1-18/b2-12 | — | — | 2 | — | — | — | — | — | — | — | — | — |
| | b1-25/b2-11 | — | — | — | 2 | — | — | — | — | — | — | — | — |
| | b1-1/b2-1 | — | — | — | — | 5 | — | — | — | — | — | — | — |
| | b1-17/b2-23 | — | — | — | — | — | 3 | — | — | — | — | — | — |
| Component (c) | c1-1/c2-1 | 0.5 | — | — | — | — | — | 0.5 | — | — | — | — | — |
| | c1-2/c2-2 | — | 0.5 | — | — | — | — | — | 0.5 | — | — | — | — |
| | c1-5/c2-7 | — | — | 0.5 | — | — | — | — | — | — | — | — | — |
| | c1-13/c2-8 | — | — | — | 0.5 | — | — | — | — | — | — | — | — |
| | c1-2/c2-6 | — | — | — | — | 0.5 | — | — | — | — | — | — | — |
| | c1-1/c2-26 | — | — | — | — | — | 0.5 | — | — | — | — | — | — |
| | c1-19/c2-14 | — | — | — | — | — | — | — | — | 0.25 | — | — | — |
| Component (d) | c1-21/b2-23 | — | — | — | — | — | 4 | — | — | — | 3 | 3 | — |
| Sensitizer | e-1 | — | — | — | — | — | — | — | — | 0.10 | — | — | — |
| Taper angle dispersion | Production Method 1 | 3% | — | 4% | 3% | 5% | — | — | 4% | 6% | 12% | — | 15% |
| | Production Method 2 | — | 2% | — | — | — | 4% | 2% | — | 5% | — | 10% | — | a-1: EPICLON N-865 (trade name, product of DIC Corporation)
a-2: JER157S70 (trade name, product of Japan Epoxy Resin Co., Ltd.)
a-3: EHPE 3150 (trade name, product of Daicel Corporation).

8a First ejection orifice patterns
8b Second ejection orifice patterns
9 90 Degrees—taper angle
10 First photomask
11 Second photomask

The invention claimed is:

1. A photosensitive negative resin composition comprising:
   (a) an epoxy-group-containing compound;
   (b) a first onium salt containing a cation portion structure represented by (b1) and an anion portion structure represented by (b2); and
   (c) a second onium salt containing a cation portion structure represented by (c1) and an anion portion structure represented by (c2),

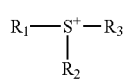

(b1)

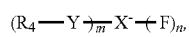

(b2)

wherein $R_1$ to $R_3$ are, independently of one another, an organic group which may be substituted and has 1 to 30 carbon atoms, with provisos that at least two oxygen atoms are included in all constituent atoms of $R_1$ to $R_3$ and that at least one of $R_1$ to $R_3$ contains a cyclic carbonyl structure, X is selected from a carbon atom, a nitrogen atom, a phosphorus atom, a boron atom and an antimony atom, Y is selected from $-S(=O)_2-$, an alkylene fluoride group, $-OCF_2-$, $-C(=O)-CF_2-$, $-O-C(=O)-CF_2-$, $-C(=O)-O-CF_2-$ and a single bond, $R_4$ is a hydrocarbon group which may be substituted by a fluorine atom and has 1 to 30 carbon atoms, and m and n are such that m+n is 3 and n is an integer selected from 0, 1 and 2 when X is the carbon atom, m+n is 2 and n is an integer selected from 0 and 1 when X is the nitrogen atom, m+n is 6 and n is an integer selected from 0 to 6 when X is the phosphorus or antimony atom, or m+n is 4 and n is an integer selected from 0 to 3 when X is the boron atom,

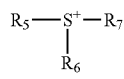

(c1)

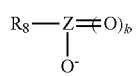

(c2)

wherein $R_5$ to $R_7$ are, independently of one another, an organic group which may be substituted and has 1 to 15 carbon atoms, with the proviso that at most one oxygen atom is included in all the constituent atoms of $R_5$ to $R_7$, Z is selected from a carbon atom and a sulfur atom, k is 1 when Z is the carbon atom, k is 2 when Z is the sulfur atom, and $R_8$ is a hydrocarbon group which may contain a heteroatom and has 1 to 20 carbon atoms.

2. The photosensitive negative resin composition according to claim 1, which satisfies a relationship, (number of moles of the first onium salt)>(number of moles of the second onium salt).

3. The photosensitive negative resin composition according to claim 2, which satisfies a relationship, (the number of moles of the first onium salt)×0.7>the number of moles of the second onium salt>(the number of moles of the first onium salt)×0.02.

4. The photosensitive negative resin composition according to claim 1, wherein the component (b) has photosensitivity to at least an i-line.

5. The photosensitive negative resin composition according to claim 1, wherein $R_8$ contains an aromatic hydrocarbon or alicyclic hydrocarbon.

6. The photosensitive negative resin composition according to claim 1, wherein Z is a sulfur atom.

7. The photosensitive negative resin composition according to claim 1, wherein X is a phosphorus atom.

8. A fine structure formed on a substrate, which is a cured product of the photosensitive negative resin composition according to claim 1.

9. A liquid ejection head comprising a flow-path-forming layer formed by the fine structure according to claim 8.

10. A process for forming a fine structure, comprising:
    (1) a step of arranging the photosensitive negative resin composition according to claim 1 on a substrate; and
    (2) a step of subjecting the photosensitive negative resin composition to a patterning treatment by photolithography using an i-line.

11. A photosensitive negative resin composition comprising:
    (a) an epoxy-group-containing compound;
    (b) a first onium salt containing a cation portion structure represented by (b1) and an anion portion structure represented by (b2); and
    (c) a second onium salt containing a cation portion structure represented by (c1) and an anion portion structure represented by (c2),

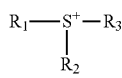

(b1)

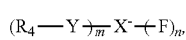

(b2)

wherein $R_1$ to $R_3$ are, independently of one another, an organic group which may be substituted and has 1 to 30 carbon atoms, with a proviso that at least two oxygen atoms are included in all constituent atoms of $R_1$ to $R_3$, X is a phosphorus atom, Y is selected from $-S(=O)_2-$, an alkylene fluoride group, $-OCF_2-$, $-C(=O)-CF_2-$, $-O-C(=O)-CF_2-$, $-C(=O)-O-CF_2-$ and a single bond, $R_4$ is a hydrocarbon group which may be substituted by a fluorine atom and has 1 to 30 carbon atoms, and m and n are such that m+n is 6 and n is an integer selected from 0 to 6,

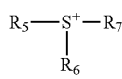

(c1)

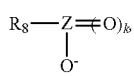

(c2)

wherein $R_5$ to $R_7$ are, independently of one another, an organic group which may be substituted and has 1 to 15 carbon atoms, with the proviso that at most one oxygen atom is included in all the constituent atoms of $R_5$ to $R_7$, Z is selected from a carbon atom and a sulfur atom, k is 1 when Z is the carbon atom, k is 2 when Z is the sulfur atom, and $R_8$ is a hydrocarbon group which may contain a heteroatom and has 1 to 20 carbon atoms.

12. The photosensitive negative resin composition according to claim 11, which satisfies a relationship, (number of moles of the first onium salt)>(number of moles of the second onium salt).

13. The photosensitive negative resin composition according to claim 12, which satisfies a relationship, (the number of moles of the first onium salt)×0.7>the number of moles of the second onium salt>(the number of moles of the first onium salt) ×0.02.

14. The photosensitive negative resin composition according to claim 11, wherein the component (b) has photosensitivity to at least an i-line.

15. The photosensitive negative resin composition according to claim 11, wherein $R_8$ contains an aromatic hydrocarbon or alicyclic hydrocarbon.

16. The photosensitive negative resin composition according to claim 11, wherein Z is a sulfur atom.

17. A fine structure formed on a substrate, which is a cured product of the photosensitive negative resin composition according to claim 11.

18. A liquid ejection head comprising a flow-path-forming layer formed by the fine structure according to claim 17.

19. A process for forming a fine structure, comprising:
(1) a step of arranging the photosensitive negative resin composition according to claim 11 on a substrate; and
(2) a step of subjecting the photosensitive negative resin composition to a patterning treatment by photolithography using an i-line.

* * * * *